(12) United States Patent
Takahashi et al.

(10) Patent No.: US 12,400,730 B2
(45) Date of Patent: Aug. 26, 2025

(54) SEMICONDUCTOR DEVICE HAVING MEMORY CELL ARRAY DIVIDED INTO PLURAL MEMORY MATS

(71) Applicant: Micron Technology, Inc., Boise, ID (US)

(72) Inventors: Susumu Takahashi, Kanagawa (JP); Hiroki Fujisawa, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 18/485,631

(22) Filed: Oct. 12, 2023

(65) Prior Publication Data

US 2024/0203520 A1    Jun. 20, 2024

Related U.S. Application Data

(60) Provisional application No. 63/387,850, filed on Dec. 16, 2022.

(51) Int. Cl.
 *G11C 29/00* (2006.01)
(52) U.S. Cl.
 CPC ............ *G11C 29/76* (2013.01); *G11C 29/702* (2013.01); *G11C 29/785* (2013.01)

(58) Field of Classification Search
 CPC ..... G11C 29/76; G11C 29/702; G11C 29/785; G11C 29/808; G11C 11/401; G11C 29/42
 See application file for complete search history.

(56) References Cited

U.S. PATENT DOCUMENTS

| | | |
|---|---|---|
| 11,450,404 B1 * | 9/2022 | Kim ................. G11C 29/787 |
| 2018/0067847 A1 * | 3/2018 | Oh .................... G06F 3/0679 |
| 2019/0140668 A1 * | 5/2019 | Kim ................. G06F 11/1068 |

FOREIGN PATENT DOCUMENTS

JP    1995141856    6/1995

* cited by examiner

*Primary Examiner* — Mohammed A Bashar
(74) *Attorney, Agent, or Firm* — Dorsey & Whitney LLP

(57) ABSTRACT

An apparatus that includes a plurality of first memory mats each including a plurality of normal column sections each storing user data, and a second memory mat including a plurality of first redundant column sections each substituting a defective one of column sections included in the plurality of first memory mats and a plurality of first BCC column sections each storing an error correction code.

19 Claims, 9 Drawing Sheets

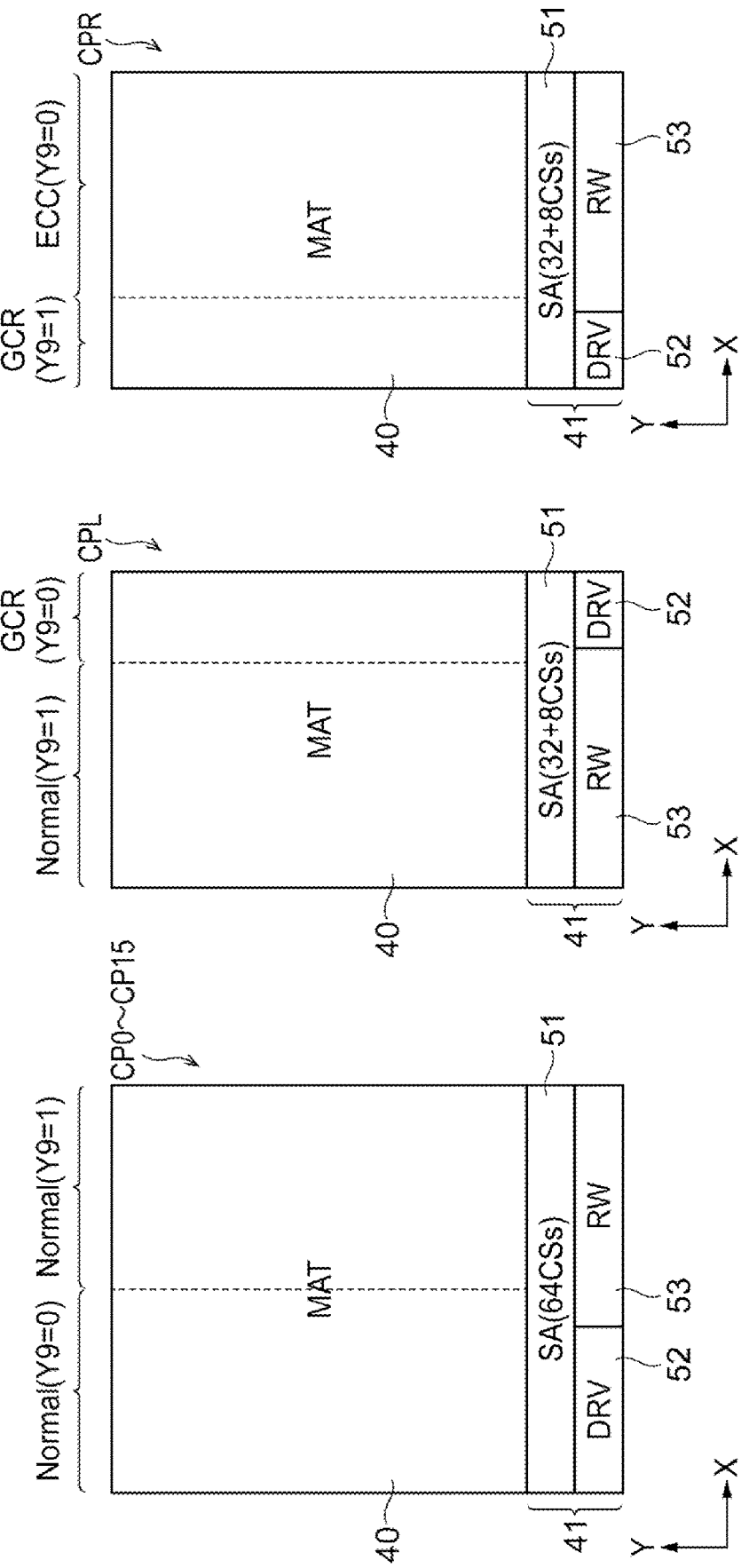

SEMICONDUCTOR DEVICE HAVING MEMORY CELL ARRAY DIVIDED INTO PLURAL MEMORY MATS

CROSS REFERENCE TO RELATED APPLICATION(S)

This application claims priority to U.S. Provisional Application No. 63/387,850, filed Dec. 16, 2022. The aforementioned application is incorporated herein by reference, in its entirety, for any purpose.

BACKGROUND

There is a case where a semiconductor memory device such as a DRAM includes a memory cell array divided into a plurality of memory mats. There is also a case where a memory cell array includes a redundant memory mat having a spare column section used for substituting a defective column section. Here, when the column size of the redundant memory mat is considerably smaller than the column size of another memory mat, the size of a sense amplifier region corresponding to the redundant memory mat is insufficient, so that it is difficult to ensure the characteristics equivalent to those of the other memory mat.

BRIEF DESCRIPTION OF THE DRAWINGS

FIG. 7A is a schematic diagram for explaining a configuration of normal column planes;

FIG. 7B and FIG. 7C are schematic diagrams for explaining a configuration of a mixed column plane;

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
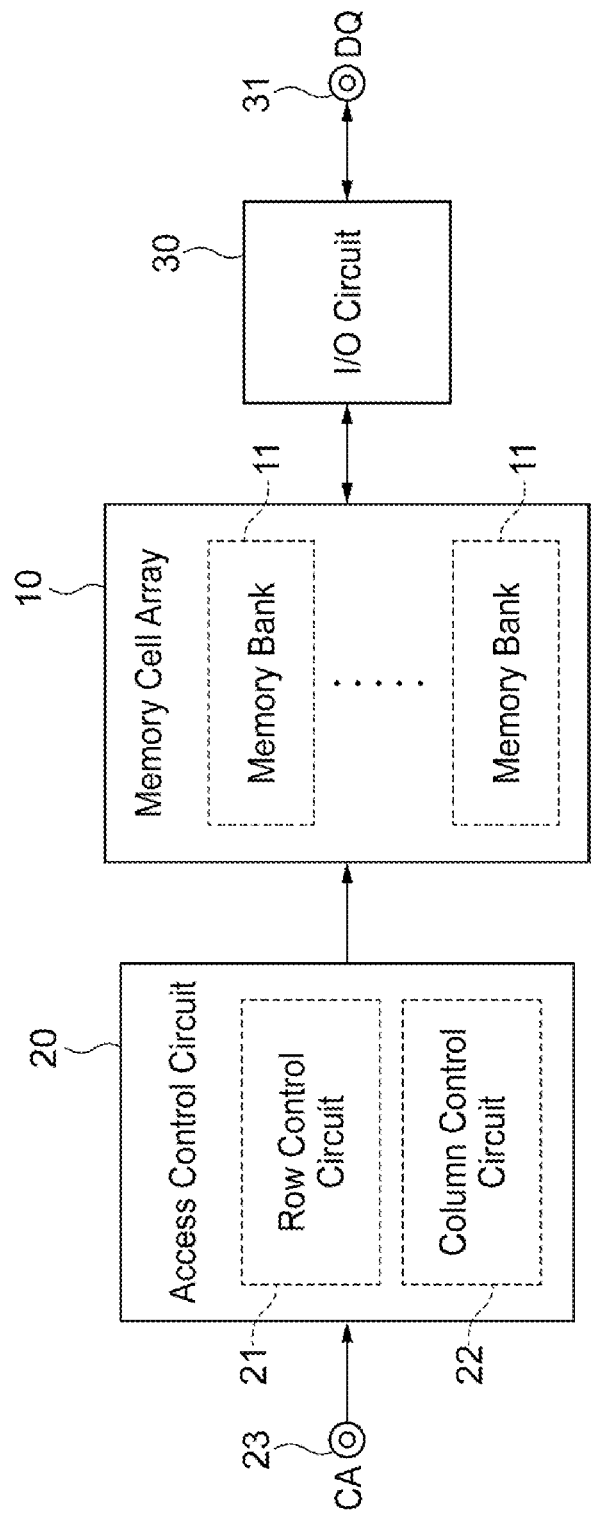
FIG. 1 is a block diagram showing an overall configuration of a semiconductor memory device according to an embodiment of the present disclosure.

FIG. 1 is a block diagram showing an overall configuration of a semiconductor memory device according to an embodiment of the present disclosure. The semiconductor memory device shown in FIG. 1 is, for example, a DRAM and includes a memory cell array 10, an access control circuit 20 that accesses the memory cell array 10, and an I/O circuit 30 that inputs and outputs data to and from the memory cell array 10. The access control circuit 20 includes a row control circuit 21 and a column control circuit 22. The access control circuit 20 accesses the memory cell array 10 based on a command address signal CA input from an external controller via a command address terminal 23. The row control circuit 21 selects a word line based on a row address. The column control circuit 22 selects a bit line based on a column address. Subsequently, in a read operation, read data DQ read out from the memory cell array 10 is output to a data I/O terminal 31 via the I/O circuit 30. In a write operation, write data DQ input to the data I/O terminal 31 from the external controller is written to the memory cell array 10 via the I/O circuit 30. The memory cell array 10 includes a plurality of memory banks 11.

Figure 2:
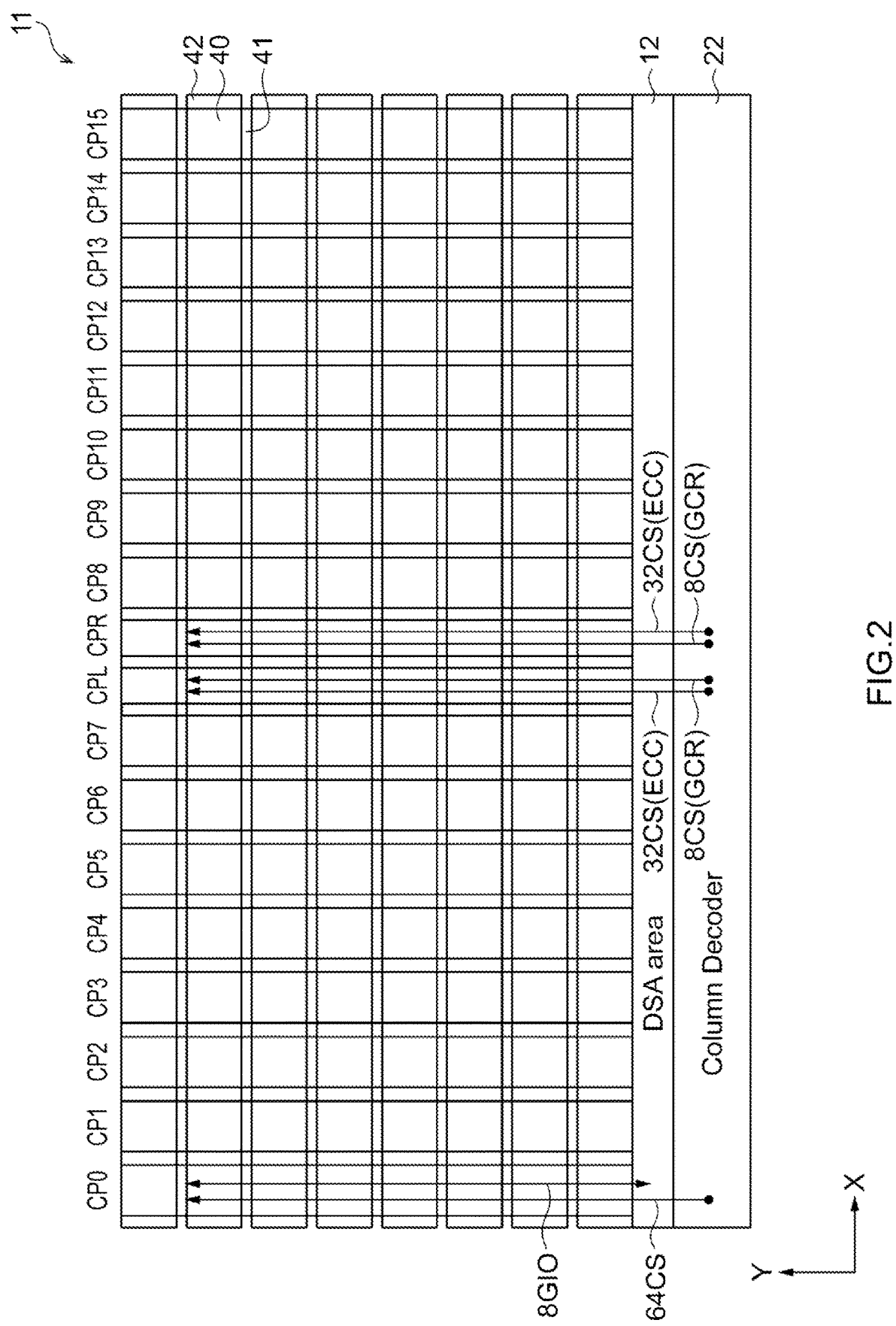
FIG. 2 is a schematic diagram for explaining a configuration of a memory bank.

FIG. 2 is a schematic diagram for explaining a configuration of the memory bank 11. As shown in FIG. 2, the memory bank 11 includes a plurality of memory mats 40 arranged in a matrix in the X direction and the Y direction. Sense amplifier regions 41 are arranged on both sides of each memory mat 40 in the Y direction. Word driver regions 42 are arranged on both sides of the memory mat 40 in the X direction. In the example shown in FIG. 2, 18 memory mats 40 are arranged in the X direction. It is determined by high-order bits of a row address as to which row the memory mat 40 is selected from, under control by the row control circuit 21 shown in FIG. 1. The 18 memory mats 40 arranged in the X direction include 16 normal column planes CP0 to CP15 and 2 mixed column planes CPL and CPR.

The normal column planes CP0 to CP15 are memory regions for retaining user data. 64 column selection signals CS are supplied to each of the normal column planes CP0 to CP15. That is, each of the normal column planes CP0 to CP15 is divided into 64 column sections. As to which column section is selected is determined by high-order bits of a column address (for example, six bits from Y4 to Y9) under control by the column control circuit 22 shown in FIG. 1. Low-order bits of the column address (for example, four bits from Y0 to Y3) are used for selecting a burst order, for example.

The mixed column planes CPL and CPR have a function of retaining an error correction code ECC for correcting an error contained in user data, as well as a function of substituting a defective column section included in the normal column planes CP0 to CP15. Each of the mixed column planes CPL and CPR includes 32 column sections used for retaining the error correction code ECC and 8 column sections used for repairing a defect. Therefore, to each of the mixed column planes CPL and CPR, 32 column selection signals CS for selecting any of the column sections for ECC and 8 column selection signals CS for selecting any of spare column sections are assigned.

Further, global I/O lines GIO for eight bits are assigned to each of the column planes CP0 to CP15, CPL, and CPR. The global I/O lines GIO are connected to a DSA region 12.

Figure 3:
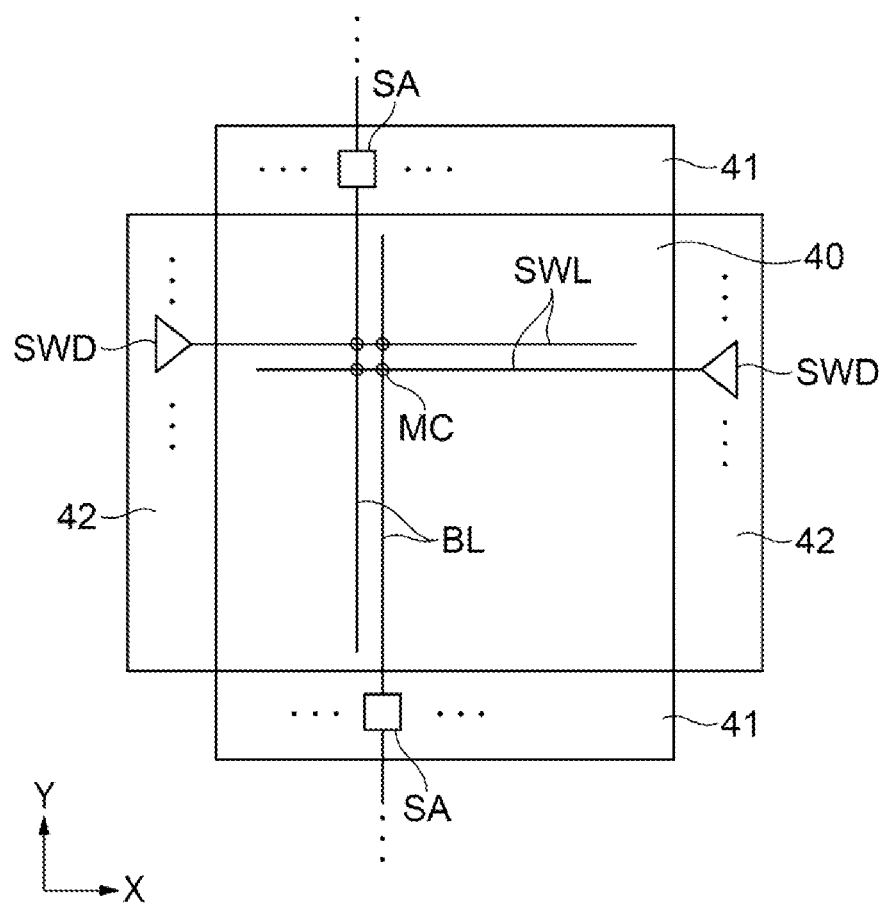
FIG. 3 is a schematic diagram for explaining a configuration of a memory mat.

FIG. 3 is a schematic diagram for explaining a configuration of the memory mat 40. As shown in FIG. 3, a plurality of sub-word lines SWL extending in the X direction, a plurality of bit lines BL extending in the Y direction, and memory cells MC respectively arranged at intersections of the sub-word lines SWL and the bit lines BL are provided in the memory mat 40. In some examples, the X direction may be perpendicular to the Y direction. The sub-word line SWL is driven by a sub-word driver SWD arranged in the word driver region 42 based on low-order bits of a row address. The bit line BL is connected to a sense amplifier SA arranged in the sense amplifier region 41.

Figure 4:
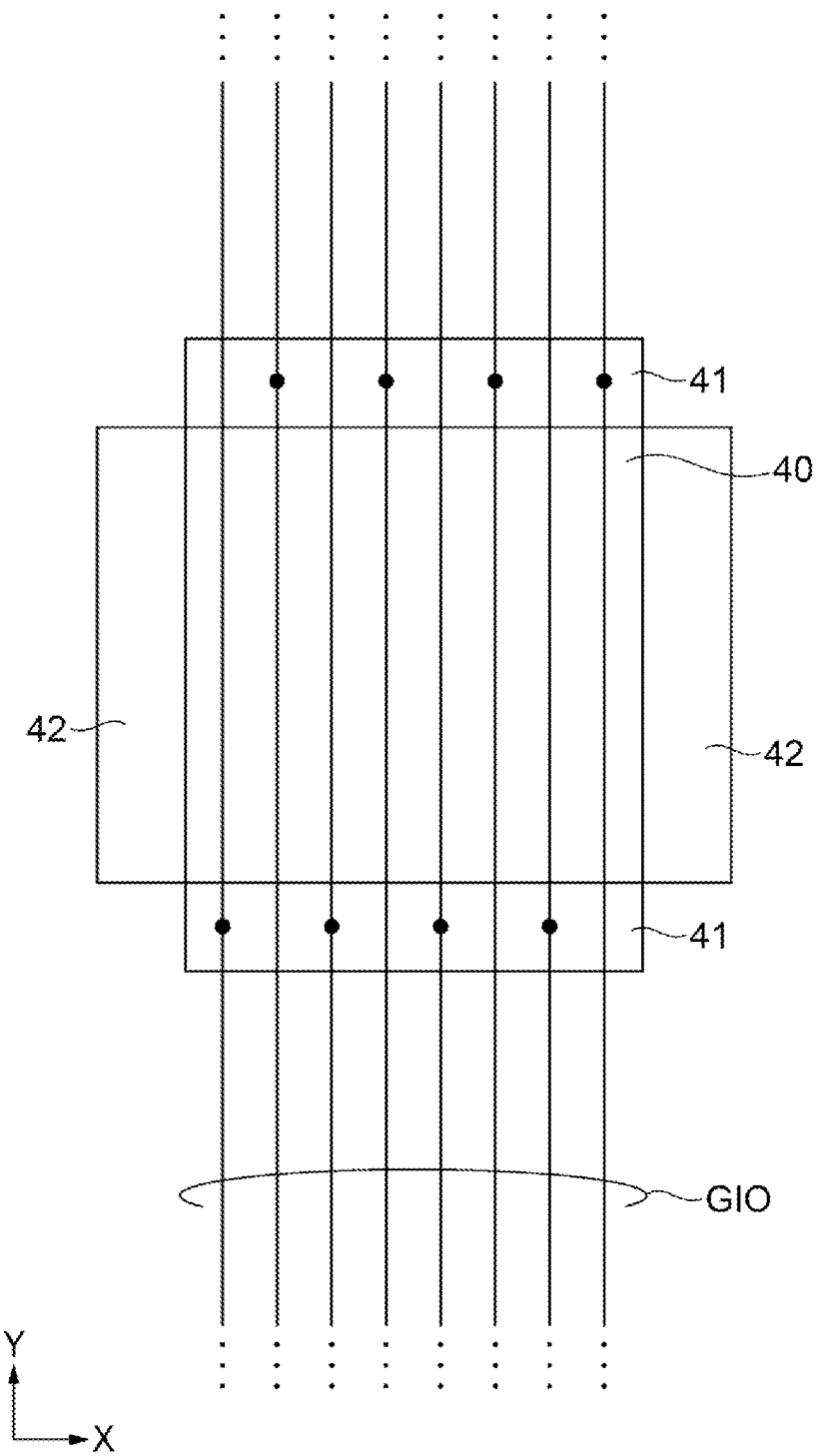
FIG. 4 is a schematic diagram for explaining a connecting relation between a sense amplifier region and global I/O lines.

FIG. 4 is a schematic diagram for explaining a connecting relation between the sense amplifier region 41 and the global I/O lines GIO. As shown in FIG. 4, eight global I/O lines GIO are arranged on one memory mat 40. Among these global I/O lines GIO, four of them are connected to one of the sense amplifier regions 41, and the other four of them are connected to the other sense amplifier region 41. With this configuration, 8-bit data is input and output simultaneously for one memory mat 40. It is selected by the column selection signal CS as to which sense amplifier SA each global I/O line GIO is connected to.

Figure 5:
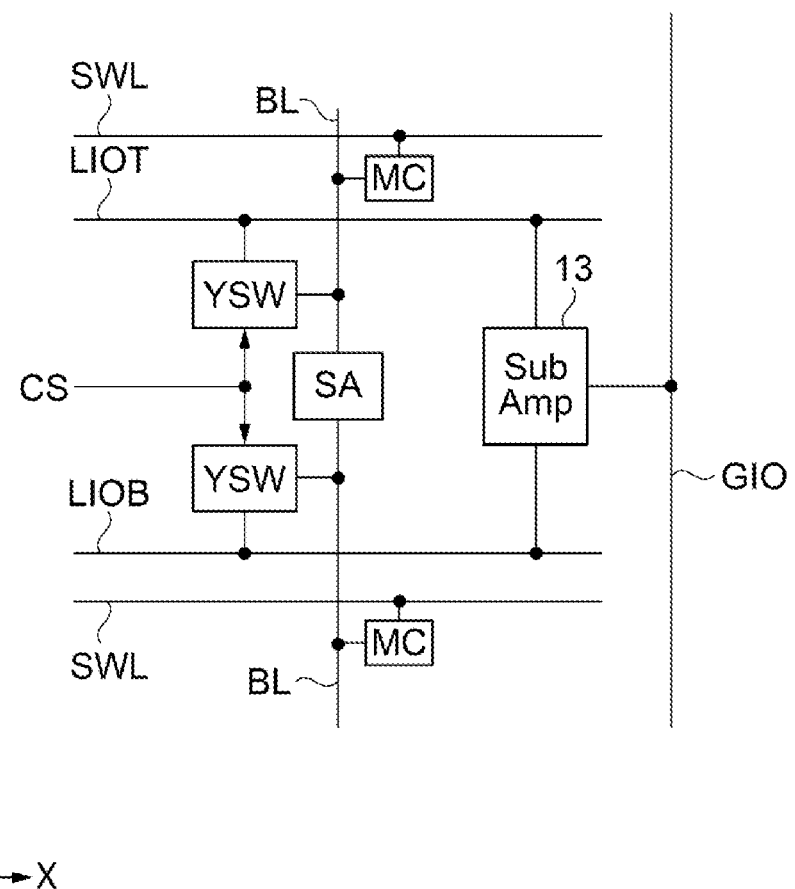
FIG. 5 is a circuit diagram for explaining a connecting relation between memory cells and a global I/O line.

FIG. 5 is a circuit diagram for explaining a connecting relation between the memory cells MC and the global I/O line GIO. As shown in FIG. 5, the sense amplifier SA connected to a pair of bit lines BL is connected to a pair of local I/O lines LIOT/LIOB via column switches YSW when a corresponding column selection signal CS is activated. The local I/O lines LIOT/LIOB extend in the X direction. The local I/O lines LIOT/LIOB are connected to a corresponding global I/O line GIO via a sub-amplifier 13. The global I/O line GIO extends in the Y direction.

Figure 6:
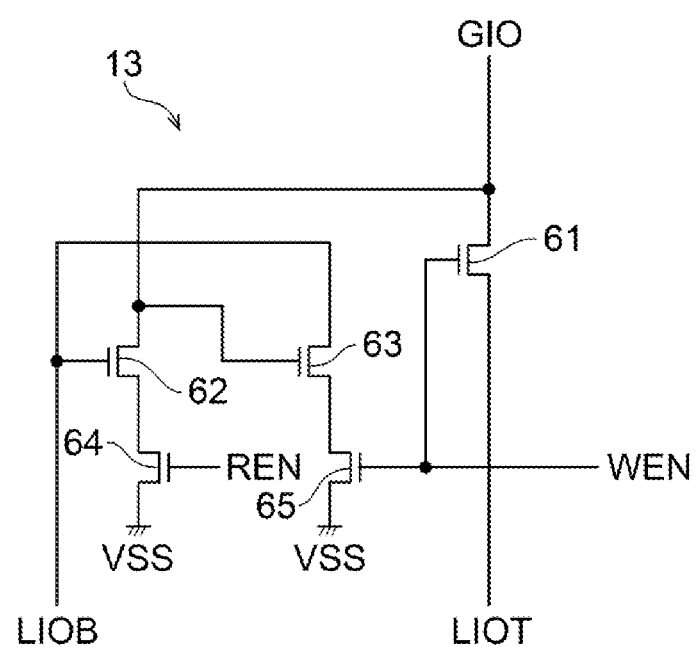
FIG. 6 is a circuit diagram of a sub-amplifier.

FIG. 6 is a circuit diagram of the sub-amplifier 13. As shown in FIG. 6, the sub-amplifier 13 includes N-channel MOS transistors 61 to 65. The transistor 61 is connected between the local I/O line LIOT and the global I/O line GIO, and a write enable signal WEN is supplied to its gate electrode. The transistors 62 and 64 are connected in series to each other between the global I/O line GIO and a power supply line to which a ground potential VSS is supplied. A gate electrode of the transistor 62 is connected to the local I/O line LIOB. A read enable signal REN is supplied to a gate electrode of the transistor 64. The transistor 63 and the transistor 65 are connected in series between the local I/O line LIOB and the power supply line to which the ground potential VSS is supplied. A gate electrode of the transistor 63 is connected to the global I/O line GIO. The write enable signal WEN is supplied to a gate electrode of the transistor 65. With this configuration, the transistors 61, 63, and 65 are turned on when the level of the global I/O line GIO is high in a write operation, and therefore the level of the local I/O line LIOT becomes high and the level of the local I/O line LIOB becomes low. Meanwhile, when the level of the global I/O line GIO is low in the write operation, the transistors 61 and 65 are turned on, and therefore the level of the local I/O line LIOT becomes low, whereas the local I/O line LIOB is maintained in a pre-charged state (a high level). Further, in a read operation, when the level of the local I/O line LIOT is high and the level of the local I/O line LIOB is low, the transistor 64 is turned on, whereas the transistor 62 is off. Therefore, the global I/O line GIO is maintained in a pre-charged state (a high level). Meanwhile, in the read operation, when the level of the local I/O line LIOT is low and the level of the local I/O line LIOB is high, the transistors 62 and 64 are turned on, so that the level of the global I/O line GIO becomes low. In this manner, the sub-amplifier 13 converts differential signals to a single-ended signal in the read operation, and converts a single-ended signal to differential signals in the write operation.

FIG. 7A is a schematic diagram for explaining a configuration of the normal column planes CP0 to CP15. FIG. 7B is a schematic diagram for explaining a configuration of the mixed column plane CPL. FIG. 7C is a schematic diagram for explaining a configuration of the mixed column plane CPR. As shown in FIGS. 7A to 7C, the sense amplifier region 41 includes a region 51 where the sense amplifiers SA are arranged, a region 52 where a driver circuit DRV that supplies an operating voltage to the sense amplifiers SA is arranged, and a region 53 where the sub-amplifiers 13 are arranged. As described above, each of the normal column planes CP0 to CP15 is divided into 64 column sections selectable by the column selection signal CS. In a case of performing selection of the column section based on high-order bits Y4 to Y9 of a column address, the memory mat 40 configuring each of the normal column planes CP0 to CP15 is divided into 32 column sections selected when the most significant bit Y9 of the column address is "0" and 32 column sections selected when the most significant bit Y9 of the column address is "1".

Meanwhile, the mixed column planes CPL and CPR each include 32 column sections for ECC and 8 spare column sections. Therefore, the column size (32CS+8CS) of each of the mixed column planes CPL and CPR is smaller than the column size (64CS) of each of the normal column planes CP0 to CP15. However, since eight global I/O lines GIO are assigned also to each of the mixed column planes CPL and CPR as with each of the normal column planes CP0 to CP15, the size in the X direction of the region 53 where the sub-amplifiers 13 are arranged is the same as the size in the X direction of the region 53 assigned to each of the normal column planes CP0 to CP15. To realize this size of region 53, the size in the X direction of the region 52 where the driver circuit DRV is arranged has to be reduced. However, as for the driver circuit DRV, a number of circuits are connected in parallel to each other, and therefore there is no problem in an actual operation.

In the mixed column plane CPL, a spare column section GCR is selected when the most significant bit Y9 of a column address is "0", and a column section for ECC is selected when the most significant bit Y9 of the column address is "1". Meanwhile, in the mixed column plane CPR, a spare column section GCR is selected when the most significant bit Y9 of the column address is "1", and a column section for ECC is selected when the most significant bit Y9 of the column address is "0". Therefore, when the most significant bit Y9 of the column address is "0", the mixed column plane CPL serves as a spare column section, and the mixed column plane CPR serves as a column section for ECC. On the other hand, when the most significant bit Y9 of the column address is "1", the mixed column plane CPR serves as a spare column section, and the mixed column plane CPL serves as a column section for ECC. However, the spare column section in the mixed column plane CPL can be used for substituting a column section belonging to a region where Y9=0 in the normal column planes CP0 to CP15, but cannot be used for substituting a column section belonging to a region where Y9=1 in the normal column planes CP0 to CP15. Similarly, the spare column section in the mixed column plane CPR can be used for substituting a column section belonging to the region where Y9=1 in the normal column planes CP0 to CP15, but cannot be used for substituting a column section belonging to the region where Y9=0 in the normal column planes CP0 to CP15.

Further, when the most significant bit Y9 of the column address is "0", and there is a defect in the column section for ECC selected in the mixed column plane CPR, the column section is substituted with the spare column section in the mixed column plane CPL. Similarly, when the most significant bit Y9 of the column address is "1", and there is a defect in the column section for ECC selected in the mixed column plane CPL, the column section is substituted with the spare column section in the mixed column plane CPR.

As described above, the semiconductor memory device according to an embodiment of the present disclosure includes the two mixed column planes CPL and CPR each including the column section for ECC and the spare column section, in addition to the normal column planes CP0 to CP15. Accordingly, even in a case where the column size of the spare column section GCR is small, the column size of each of the mixed column planes CPL and CPR is ensured to some extent. Therefore, the sub-amplifiers 13 the number of which is the same as the number of the sub-amplifiers 13 assigned to each of the normal column planes CP0 to CP15 can be arranged in the sense amplifier region 41 of each of the mixed column planes CPL and CPR. The column section for ECC included in each of the mixed column planes CPL and CPR can be substituted with any column section in the normal column planes CP0 to CP15. For example, any of 32 column sections selected in the normal column plane CP0 when Y9=0 may be substituted with the column section for ECC in the mixed column plane CPR, and any of 32 column sections selected in the normal column plane CP0 when Y9=1 may be substituted with the column section for ECC in the mixed column plane CPL.

Figure 8B:
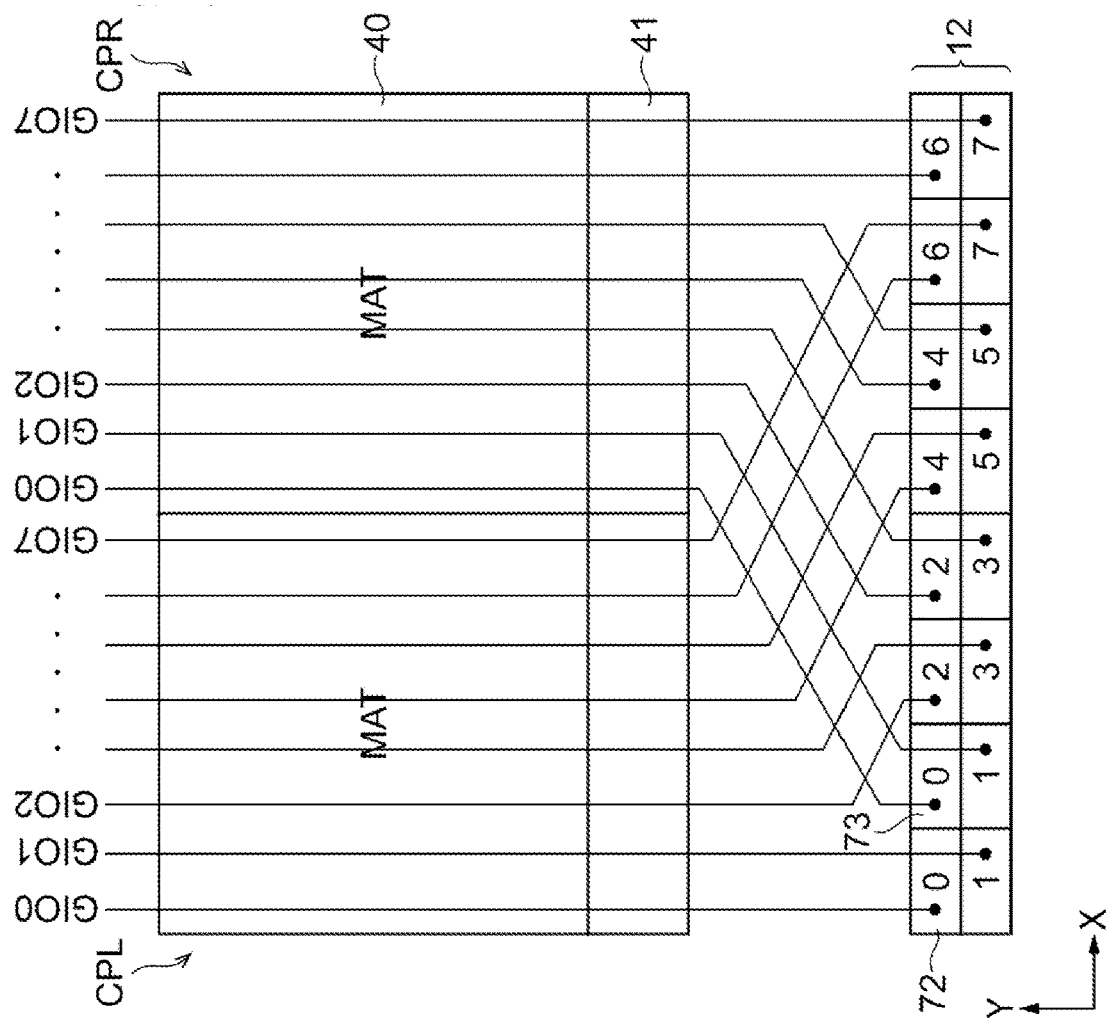
FIG. 8B is a schematic diagram for explaining a connecting relation between data control circuits arranged in the DSA region and mixed column planes.
Figure 8A:
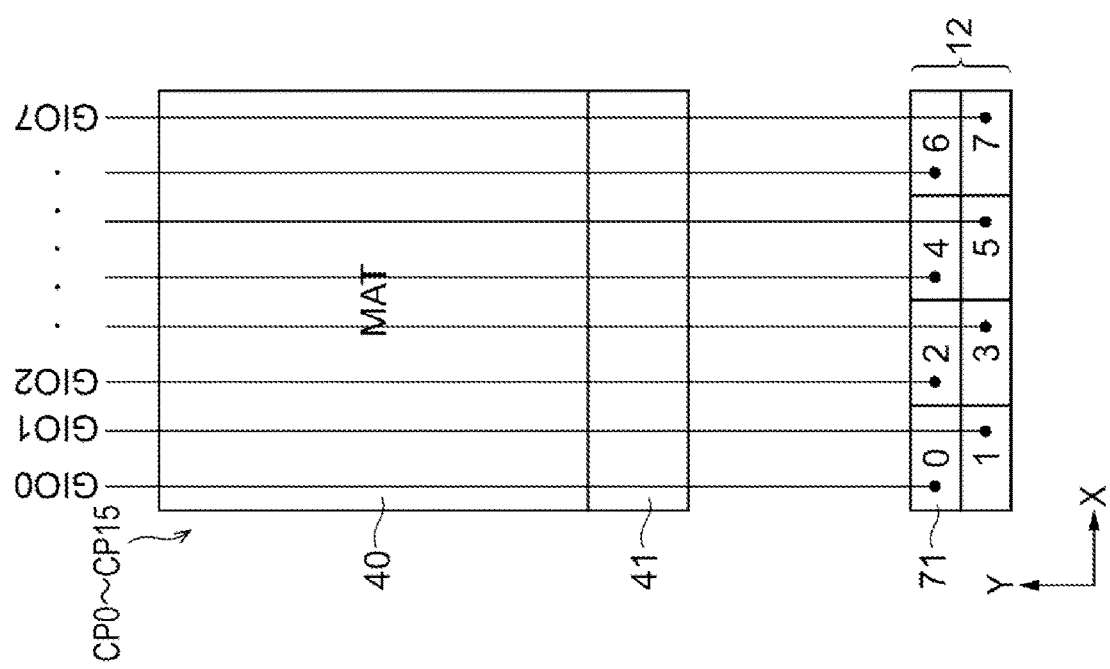
FIG. 8A is a schematic diagram for explaining a connecting relation between data control circuits arranged in a DSA region and a normal column plane.

FIG. 8A is a schematic diagram for explaining a connecting relation between data control circuits arranged in the DSA region 12 and the normal column plane CP0. FIG. 8B is a schematic diagram for explaining a connecting relation between data control circuits arranged in the DSA region 12 and the mixed column planes CPL and CPR. As shown in FIG. 8A, eight data control circuits 71 assigned to eight global I/O lines GIO0 to GIO7, respectively, are arranged in the DSA region 12 corresponding to the normal column plane CP0. The global I/O lines GIO0 to GIO7 connecting the normal column plane CP0 and the data control circuits 71 to each other extend substantially linearly in the Y direction. The same description can be also applied to the relation between the other normal column planes CP1 to CP15 and the data control circuits 71.

Meanwhile, as shown in FIG. 8B, in the DSA region 12 corresponding to the mixed column planes CPL and CPR, data control circuits 72 assigned to the mixed column plane CPL and data control circuits 73 assigned to the mixed column plane CPR are arranged to be adjacent to each other in the X direction. For example, the data control circuit 72 assigned to the global I/O line GIO0 of the mixed column plane CPL and the data control circuit 73 assigned to the global I/O line GIO0 of the mixed column plane CPR are adjacent to each other in the X direction. The same description can be applied to the other global I/O lines GIO1 to GIO7 related to the mixed column planes CPL and CPR. To realize this configuration, a part of the global I/O lines GIO0 to GIO7 of the mixed column plane CPL and a part of the global I/O lines GIO0 to GIO7 of the mixed column plane CPR cross each other as shown in FIG. 8B.

Figure 9:
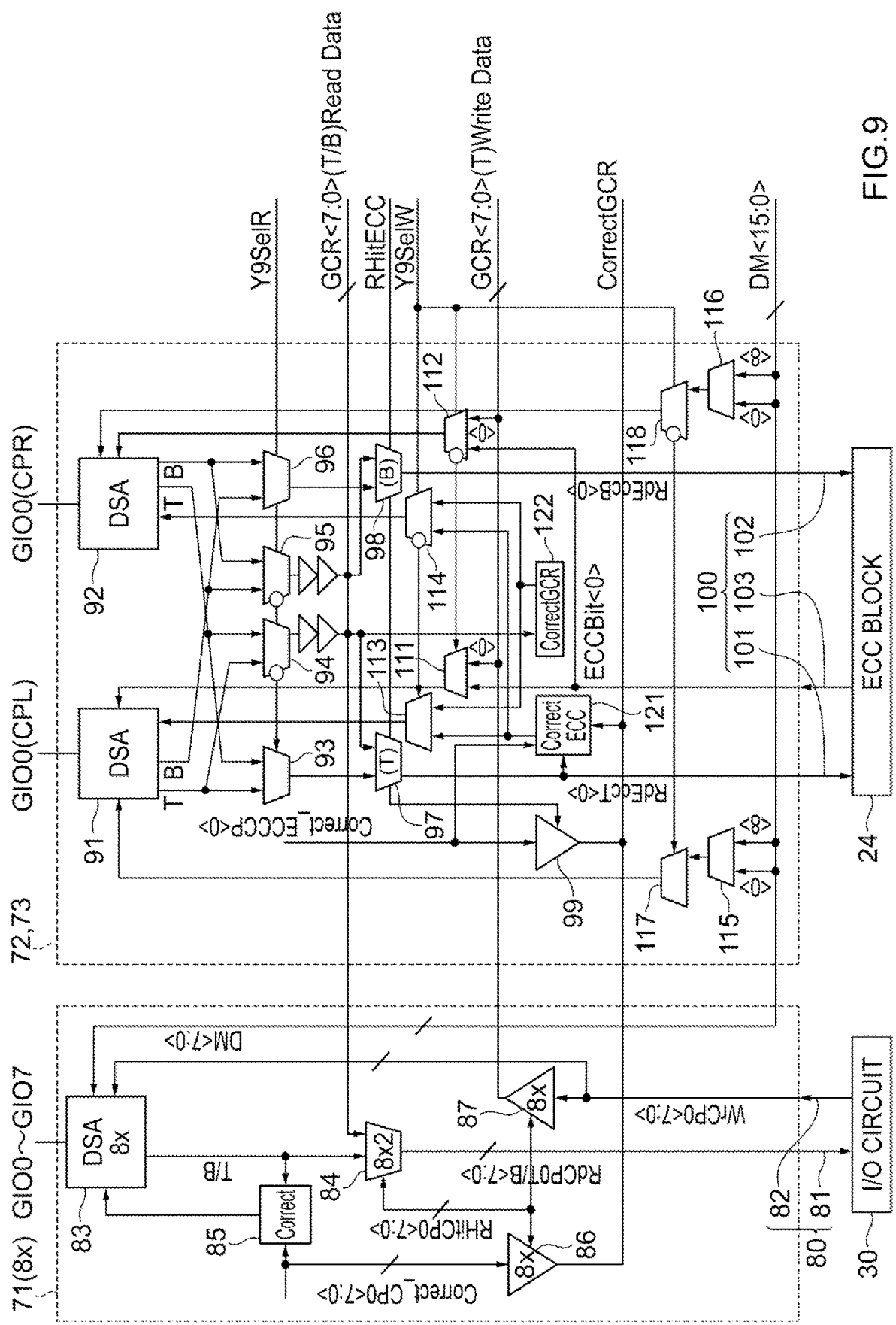
FIG. 9 is a circuit diagram of data control circuits.

FIG. 9 is a circuit diagram of the data control circuits 71 to 73. As shown in FIG. 9, the eight data control circuits 71 assigned to the normal column plane CP0 are connected to the I/O circuit 30 via a data path 80. The data path 80 is configured by a read data path 81 used in a read operation and a write data path 82 used in a write operation. Complementary lines T/B are used for the read data path 81, whereas a single-ended line is used for the write data path 82. Further, the two data control circuits 72 and 73 assigned to the global I/O line GIO0 of the mixed column planes CPL and CPR are connected to an ECC block 24 via an ECC path 100. The ECC path 100 is configured by read ECC paths 101 and 102 used in a read operation and a write ECC path 103 used in a write operation. Complementary lines T/B are used for the read ECC paths 101 and 102, whereas a single-ended line is used for the write ECC path 103.

In the read operation, 8-bit read data is transferred from the normal column plane CP0 via the global I/O lines GIO0 to GIO7. The eight bits of the read data are amplified by corresponding data amplifiers 83, respectively, and are transferred to the I/O circuit 30 as read data RdCP0 T/B<7:0> via the read data path 81. In a case where there is a defect in a selected column section, any of hit signals RHitCP0<7:0> is activated. The hit signals RHitCP0<7:0> are used as a selection signal of a multiplexer 84. The multiplexer 84 transfers the read data RdCP0 T/B<7:0> output from the data amplifiers 83 to the read data path 81 as it is when any of the hit signals RHitCP0<7:0> is not active. When any of the hit signals RHitCP0<7:0> is active, the multiplexer 84 transfers read data GCR<7:0> read out from the mixed column plane CPL or CPR to the read data path 81 based on the active one of the hit signals RHitCP0<7:0>, in place of the read data output from the data amplifiers 83.

Further, in the read operation, the error correction code ECC is read out from one of the mixed column planes CPL and CPR. As described above, it is determined by the most significant bit Y9 of a column address as to which one of the mixed column planes CPL and CPR the error correction code ECC is read out from. When the most significant bit Y9 of the column address is "0", the error correction code ECC is read out from the mixed column plane CPR. In the error correction code ECC read out from the mixed column plane CPR, a bit transferred via the global I/O line GIO0 is amplified by a data amplifier 92 in the data control circuit 73. The data amplifier 92 outputs the amplified signal as complementary signals including a true signal T and a bar signal B. The true signal T is input to multiplexers 93 and 94, and the bar signal B is input to multiplexers 95 and 96. On the other hand, when the most significant bit Y9 of the column address is "1", the error correction code ECC is read out from the mixed column plane CPL. In the error correction code ECC read out from the mixed column plane CPL, a bit transferred via the global I/O line GIO0 is amplified by the data amplifier 91 in the data control circuit 72. The data amplifier 91 outputs the amplified signal as complementary signals including a true signal T and a bar signal B. The true signal T is input to the multiplexers 93 and 94, and the bar signal B is input to the multiplexers 95 and 96.

To the multiplexers 93 to 96, a selection signal Y9selR is supplied which is determined by the most significant bit Y9 of the column address. When the selection signal Y9selR indicates that the most significant bit Y9 of the column address is "0", the multiplexers 93 and 96 select an output signal of the data amplifier 92. When the selection signal Y9selR indicates that the most significant bit Y9 of the column address is "1", the multiplexers 93 and 96 select an output signal of the data amplifier 91. The signal selected by the multiplexers 93 and 96 is output as error correction codes RdEcc T/B<0> to the read ECC paths 101 and 102 via multiplexers 97 and 98. In the read operation, the ECC block 24 performs an error validation operation on read data based on error correction codes RdEcc T/B. When the error validation operation reveals that the read data contains an error, the ECC block 24 generates a correction signal. Correction signals corresponding to the normal column plane CP0 are Correct_CP0<7:0> shown in FIG. 9. When any of the correction signals Correct_CP0<7:0> is active, corresponding read data RdCP0 T/B<7:0> is corrected by a correction circuit 85. Further, when two corresponding bits in the hit signals RHitCP0<7:0> and the correction signals Correct_CP0<7:0> are both active, a correction signal Correct GCR is generated via a buffer 86.

Further, in a case where there is a defect in a column section of the normal column planes CP0 to CP15 which is selected based on a column address, read data GCR<7:0> for substituting is read out from one of the mixed column planes CPL and CPR. As described above, it is determined by the most significant bit Y9 of the column address which one of the mixed column planes CPL and CPR the read data GCR<7:0> is read out from. When the most significant bit Y9 of the column address is "0", the read data GCR<7:0> is read out from the mixed column plane CPL. In the read data GCR<7:0> read out from the mixed column plane CPL, bit read data GCR<0> transferred via the global I/O line GIO0 is amplified by the data amplifier 91 in the data control circuit 72. On the other hand, when the most significant bit Y9 of the column address is "1", read data GCR<7:0> is read out from the mixed column plane CPR. In the read data GCR<7:0> read out from the mixed column plane CPR, bit read data GCR<0> transferred via the global I/O line GIO0 is amplified by the data amplifier 92 in the data control circuit 73. Output signals of the data amplifiers 91 and 92 are supplied to the multiplexers 93 to 96.

When the selection signal Y9selR indicates that the most significant bit Y9 of the column address is "0", the multiplexers 94 and 95 select the output signal of the data amplifier 91. When the selection signal Y9selR indicates that the most significant bit Y9 of the column address is "1", the multiplexers 94 and 95 select the output signal of the data amplifier 92. The read data GCR<7:0> selected by the multiplexers 94 and 95 is supplied to the multiplexer 84 in the data control circuit 71. A true signal T of the read data GCR<7:0> output from the multiplexer 94 is also supplied to the multiplexer 97, and a bar signal B of the read data GCR<7:0> output from the multiplexer 95 is also supplied to the multiplexer 98. To the multiplexers 97 and 98, a hit signal RHitECC is supplied as a selection signal. The hit signal RHitECC is activated when there is a defect in one of column sections used for retaining the error correction code ECC, which is selected based on the column address. When the hit signal RHitECC is activated, the multiplexers 97 and 98 select the read data GCR<7:0> and supply it to the ECC block 24. Accordingly, the column section can be repaired between the mixed column planes CPL and CPR. In addition, when the hit signal RHitECC is active, the correction signal Correct GCR is generated via a buffer 99.

In a write operation, 8-bit write data WrCP0<7:0> supplied from the I/O circuit 30 is supplied to the eight data amplifiers 83 via the write data path 82. The 8-bit write data WrCP0<7:0> is thus transferred to the normal column plane CP0 via the global I/O lines GIO0 to GIO7 and written to a column section specified by a column address. When any of the hit signals RHitCP0<7:0> is active, a corresponding bit of the write data WrCP0<7:0> is transferred as write data GCR<7:0> to the column plane CPL or CPR via a buffer 87. In the write data GCR<7:0>, write data GCR<0> assigned to the global I/O line GIO0 is supplied to multiplexers 111 and 112. A bit ECCBit<0> of an error correction code is also supplied to the multiplexers 111 and 112 via the write ECC path 103 in common. A selection signal Y9selW determined by the most significant bit Y9 of the column address is supplied to the multiplexers 111 and 112. When the selection signal Y9selW indicates that the most significant bit Y9 of the column address is "0", the write data GCR<0> is output from the multiplexer 111 and supplied to the data amplifier 91. In this case, the bit ECCBit<0> of the error correction code is output from the multiplexer 112 and supplied to the data amplifier 92. When the selection signal Y9selW indicates that the most significant bit Y9 of the column address is "1", the write data GCR<0> is output from the multiplexer 112 and supplied to the data amplifier 92. In this case, the bit ECCBit<0> of the error correction code is output from the multiplexer 111 and supplied to the data amplifier 91. Accordingly, when the most significant bit Y9 of the column address is "0", the write data GCR<7:0> is written to the mixed column plane CPL, and the error correction code ECC is written to the mixed column plane CPR. When the most significant bit Y9 of the column address is "1", the write data GCR<7:0> is written to the mixed column plane CPR, and the error correction code ECC is written to the mixed column plane CPL.

An error in data in the mixed column planes CPL and CPR is corrected by correction circuits 121 and 122. The correction circuit 121 is used for error correction for a column section for ECC, and the correction circuit 122 is used for error correction for a spare column section. One of outputs of the correction circuits 121 and 122 is supplied to the data amplifier 91, and the other is supplied to the data amplifier 92, via multiplexers 113 and 114. This selection is performed based on the selection signal Y9selW.

Corresponding bits of data mask signals DM<15:0> are supplied to the data control circuits 71 to 73. Here, data mask signals DM<7:0> are supplied to the data control circuit 71 corresponding to the normal column plane CP0. Data mask signals DM<0> and DM<8> are supplied to the data control circuits 72 and 73 corresponding to the global I/O lines GIO0 of the mixed column planes CPL and CPR. One of the data mask signals DM<0> and DM<8> is supplied to the data amplifier 91 and the other is supplied to the data amplifier 92, via multiplexers 115 to 118. This selection is based on the selection signal Y9selW.

With this circuit configuration, one of the mixed column planes CPL and CPR can be used as a column plane for the error correction code ECC, and the other can be used as a column plane for repairing a defect, based on the most significant bit Y9 of the column address. Further, since the data control circuit 72 corresponding to the global I/O line GIO0 of the mixed column plane CPL and the data control circuit 73 corresponding to the global I/O line GIO0 of the mixed column plane CPR are arranged to be adjacent to each other in the X direction, a wiring distance in the data control circuits 72 and 73 can be reduced.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a plurality of first memory mats each including a plurality of normal column sections each storing user data; and
a second memory mat including a plurality of first redundant column sections each substituting a defective one of column sections included in the plurality of first memory mats and a plurality of first ECC column sections each storing an error correction code, wherein the plurality of first redundant column sections and the plurality of first ECC column sections are configured to be exclusively selected based on a column address.

2. The apparatus of claim 1,
wherein the plurality of normal column sections include a plurality of first normal column sections and a plurality of second normal column sections,
wherein one of the plurality of first normal column sections is selected when a first bit of the column address indicates a first logic level,
wherein one of the plurality of second normal column sections is selected when the first bit of the column address indicates a second logic level different from the first logic level, and
wherein one of the plurality of first ECC column sections is selected when the first bit of the column address indicates the second logic level.

3. The apparatus of claim 2,
wherein one of the plurality of first redundant column sections is selected when the defective one of column sections is included in the plurality of first normal column sections.

4. The apparatus of claim 1, wherein the plurality of first redundant column sections is different in column size from the plurality of first ECC column sections.

5. The apparatus of claim 4, wherein the plurality of first redundant column sections is smaller in column size than the plurality of first ECC column sections.

6. The apparatus of claim 1, wherein the second memory mat is different in column size from each of the plurality of first memory mats.

7. The apparatus of claim 6, wherein the second memory mat is smaller in column size than each of the plurality of first memory mats.

8. The apparatus of claim 2, further comprising a third memory mat including a plurality of second redundant column sections and a plurality of second ECC column sections,
wherein one of the plurality of second ECC column sections is selected when the first bit of the column address indicates the first logic level, and
wherein one of the plurality of second redundant column sections is selected when one of the plurality of second normal column sections is defective.

9. The apparatus of claim 8, wherein the second and third memory mats are adjacently arranged.

10. The apparatus of claim 8, further comprising:
a first amplifier coupled to the second memory mat;
a second amplifier coupled to the third memory mat;
a first multiplexer configured to couple one of the first and second amplifiers to a user data path; and
a second multiplexer configured to couple another of the first and second amplifiers to an ECC path.

11. The apparatus of claim 10, wherein the first and second multiplexer are configured to be controlled by the first bit of the column address.

12. The apparatus of claim 10, wherein the first and second amplifiers are adjacently arranged.

13. The apparatus of claim 10, further comprising a third multiplexer configured to couple one of the user data path and the ECC path to an ECC circuit.

14. An apparatus comprising:
a first memory mat including a plurality of first normal column sections and a plurality of second normal column sections;
a second memory mat including a plurality of first redundant column sections and a plurality of third normal column sections; and
a third memory mat including a plurality of second redundant column sections and a plurality of fourth normal column sections,
wherein a defective one of the first normal column sections is configured to be substituted with one of the plurality of first redundant column sections, and
wherein a defective one of the second normal column sections is configured to be substituted with one of the plurality of second redundant column sections.

15. The apparatus of claim 14,
wherein each of the plurality of third normal column sections is configured to store a first error correction code assigned to a first user data stored in the plurality of second normal column sections, and
wherein each of the plurality of fourth normal column sections is configured to store a second error correction code assigned to a second user data stored in the plurality of first normal column sections.

16. The apparatus of claim 15,
wherein a defective one of the fourth normal column sections is configured to be substituted with another one of the plurality of first redundant column sections, and
wherein a defective one of the third normal column sections is configured to be substituted with another one of the plurality of second redundant column sections.

17. An apparatus comprising:
a first memory mat including a plurality of first column sections and a plurality of second column sections; and
a second memory mat including a plurality of third column sections and a plurality of fourth column sections,
wherein one of the plurality of first column sections or one of the plurality of third column sections is configured to be exclusively selected when a first bit of a column address is in a first logic level, and
wherein both one of the plurality of second column sections and one of the plurality of fourth column sections are configured to be selected when the first bit of the column address is in a second logic level.

18. The apparatus of claim 17, further comprising a third memory mat including a plurality of fifth column sections and a plurality of sixth column sections,
wherein one of the plurality of second column sections or one of the plurality of fourth column sections is configured to be exclusively selected when the first bit of the column address is in the second logic level, and
wherein both one of the plurality of first column sections and one of the plurality of sixth column sections are configured to be selected when the first bit of the column address is in the first logic level.

19. The apparatus of claim 18, wherein each of the second and third memory mat is smaller in column size than the first memory mat.

\* \* \* \* \*